United States Patent
Nishiuchi et al.

(10) Patent No.: US 6,872,260 B2
(45) Date of Patent: Mar. 29, 2005

(54) DEPOSITED-FILM FORMING APPARATUS

(75) Inventors: Takeshi Nishiuchi, Osaka (JP); Ikuo Shimamoto, Hyogo (JP); Fumiaki Kikui, Osaka (JP); Yoshimi Tochishita, Hyogo (JP); Kazumitsu Sato, Hyogo (JP)

(73) Assignee: Neomax Co., Ltd., Osaka (JP)

( * ) Notice: Subject to any disclaimer, the term of this patent is extended or adjusted under 35 U.S.C. 154(b) by 0 days.

(21) Appl. No.: 09/813,129

(22) Filed: Mar. 21, 2001

(65) Prior Publication Data

US 2001/0036508 A1 Nov. 1, 2001

(30) Foreign Application Priority Data

Mar. 23, 2000 (JP) ...................................... 2000-081142

(51) Int. Cl.$^7$ .............................................. C23C 14/00
(52) U.S. Cl. ........................ 118/716; 118/726; 118/730
(58) Field of Search ................................ 118/716, 726, 118/730

(56) References Cited

U.S. PATENT DOCUMENTS

| | | | | |
|---|---|---|---|---|
| 3,517,644 A | * | 6/1970 | Baer | 118/716 |
| 3,636,404 A | * | 1/1972 | Passmore | 392/389 |
| 4,116,161 A | * | 9/1978 | Steube | 118/716 |
| 4,770,723 A | | 9/1988 | Sagawa et al. | 148/302 |
| 4,792,368 A | | 12/1988 | Sagawa et al. | 148/302 |
| 5,201,956 A | * | 4/1993 | Humphrey | 118/716 |
| 6,280,792 B1 | * | 8/2001 | Tochishita et al. | 427/248.1 |
| 6,326,056 B1 | * | 12/2001 | Yira | 427/248.1 |

FOREIGN PATENT DOCUMENTS

| | | |
|---|---|---|
| DD | DD 244 993 A1 | 4/1987 |
| EP | 0 992 605 A2 | 4/2000 |
| JP | 57-188677 * | 11/1982 |
| JP | 7-70738 | 3/1995 |
| JP | 07-070738 * | 3/1995 |

OTHER PUBLICATIONS

Patent Abstracts of Japan, JP07–070738, Jul. 31, 1995, vol. 1995, no. 06, (abstract only).
Patent Abstracts of Japan, JP62–060212, Aug. 11, 1987, vol. 011, no. 245 (abstract only).
Graham Legge; "Ion Vapor Deposited Coatings for Improved Corrosion Protection"; Industrial Heating; Sep. 1994; pp 135–140.
Chinese Office Action dated Mar. 24, 2004 with partial English–translation.

* cited by examiner

Primary Examiner—Richard Bueker
(74) Attorney, Agent, or Firm—Armstrong, Kratz, Quintos Hanson, & Brooks, LLP.

(57) ABSTRACT

With the deposited-film forming apparatus according to the first embodiment of the present invention, the distance between the tubular barrel and the evaporating section can be varied, unlike the prior art deposited-film forming apparatus and hence, the efficient formation of the deposited film on the surface of each of the work pieces accommodated in the tubular barrel and the inhibition of the softening of the formed film can be achieved simultaneously. Therefore, it is possible to inhibit the damaging of the deposited film formed on the surface of each of the work pieces and the production of projections on the deposited film, and to form a deposited film at a high quality in respect of a corrosion resistance and the like and at low cost.

With the deposited-film forming apparatus according to the second embodiment of the present invention, the distance between the accommodating section defined in the tubular barrel and the evaporating section can be varied and hence, this deposited-film forming apparatus also exhibits an effect similar to that in the deposited-film forming apparatus according to the first embodiment of the present invention.

2 Claims, 7 Drawing Sheets

PRIOR ART

DEPOSITED-FILM FORMING APPARATUS

BACKGROUND OF THE INVENTION

1. Field of the Invention

The present invention relates to a deposited-film forming apparatus suitable for forming a deposited film of aluminum or the like on the surface of a work piece such as a rare earth metal-based permanent magnet.

2. Description of the Related Art

A rare earth metal-based permanent magnet such as an R—Fe—B based permanent magnet, of which an Nd—Fe—B based permanent magnet is representative, is used at present in a variety of fields, because it has a high magnetic characteristic.

However, the rare earth metal-based permanent magnet contains metal species (particularly, R) liable to be corroded by oxidation in the atmosphere. Therefore, when the rare earth metal-based permanent magnet is used without being subjected to a surface treatment, the corrosion of the magnet is advanced from its surface due to the influence of a small amount of acid, alkali and/or water to produce rust, thereby bringing about the deterioration and dispersion of the magnetic characteristic. Further, when the magnet having the rust produced therein is incorporated into a device such as a magnetic circuit, there is a possibility that the rust is scattered to pollute surrounding parts or components.

With the foregoing in view, it is a conventional practice to form a deposited film of aluminum or the like on the surface of a rare earth metal-based permanent magnet for the purpose of providing an excellent corrosion resistance to the rare earth metal-based permanent magnet.

Figure 9:
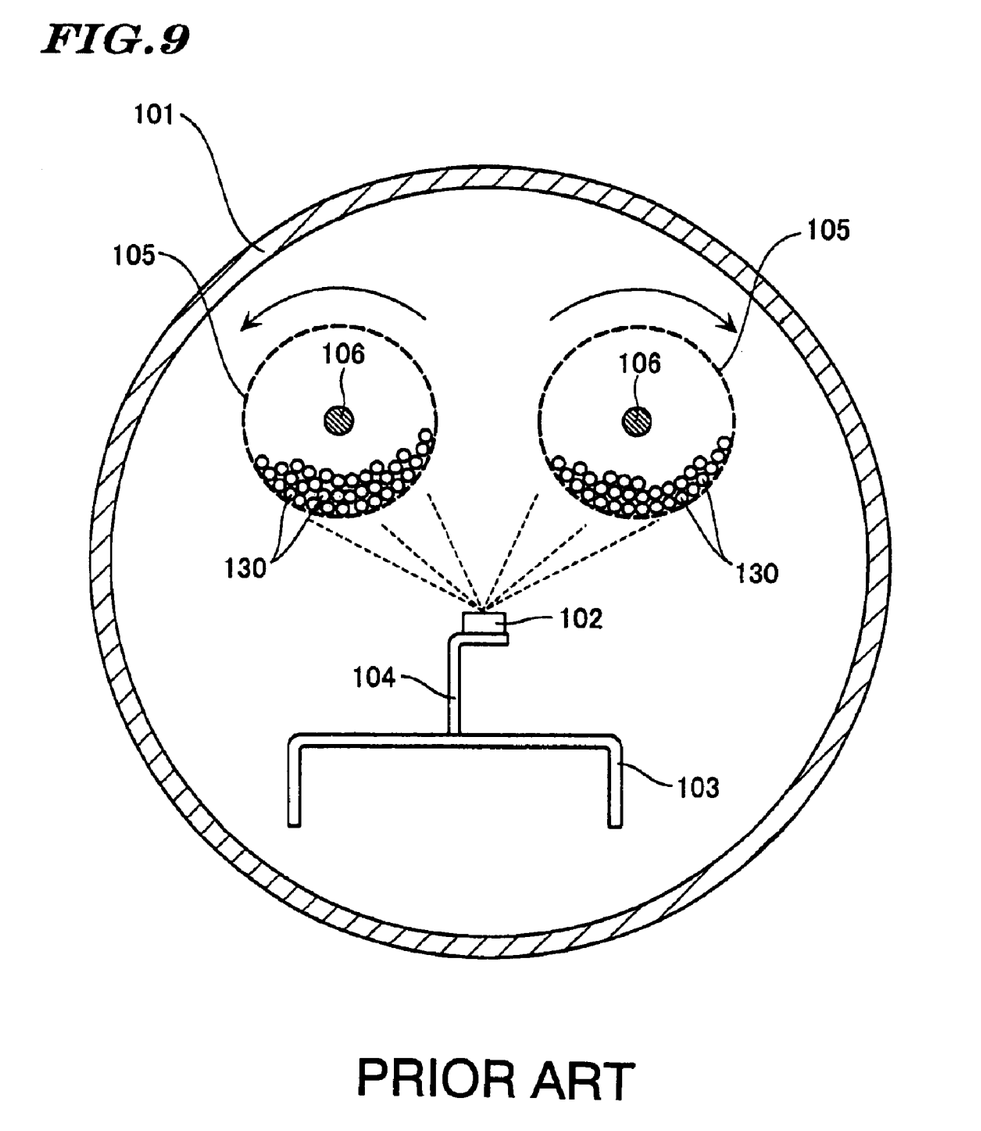
FIG. 9 is a diagrammatic front view (a partially perspective view) of the inside of a vacuum-treating chamber in the prior art deposited-film forming apparatus.

Examples of conventionally known apparatus used for forming a deposited film of aluminum or the like on the surface of a rare earth metal-based permanent magnet, include an apparatus described in U.S. Pat. No. 4,116,161 and an apparatus described in Graham Legge "Ion Vapor Deposited Coatings for Improved Corrosion Protection" Reprinted from Industrial Heating, September, 135–140, 1994. FIG. 9 is a diagrammatic front view (a partially perspective view) of the inside of a vacuum-treating chamber 101 connected to an evacuating system (not shown) in one example of such apparatus. Two cylindrical barrels 105, for example, formed of a mesh net of a stainless steel are disposed side-by-side in an upper area in the chamber for rotation about a rotary shaft 106 on a horizontal rotational axis. A plurality of boats 102, which are evaporating sections for evaporating aluminum as a depositing material, are disposed on a boat support base 104 risen on a support table 103 in a lower area in the chamber.

With this apparatus, a plurality of rare earth metal-based permanent magnets 130 as work pieces are placed into each of the cylindrical barrels 105, and aluminum is evaporated from the boats 102 heated to a predetermined temperature by a heating means (not shown), while rotating the cylindrical barrels about the rotary shaft 106, as shown by an arrow in FIG. 9, thereby forming a deposited film of aluminum on the surface of each of the rare earth metal-based permanent magnets 130 in the cylindrical barrels 105.

The deposited-film forming apparatus shown in FIG. 9 is capable of treating a large amount of the work pieces and excellent in productivity. However, damage may be observed in some cases on the deposited film of aluminum formed on each of the rare earth metal-based permanent magnets. This damage exerts an adverse influence to the provision of a corrosion resistance to the rare earth metal-based permanent magnets, causing the increase in yield to be impeded. In addition, projections may be produced in some cases on the deposited film of aluminum formed on each of the rare earth metal-based permanent magnets, and when the magnet is incorporated into a part using an adhesive, such projections may exert an adverse influence to the adhesion.

SUMMARY OF THE INVENTION

Accordingly, it is an object of the present invention to provide a deposited-film forming apparatus capable of forming a deposited film of aluminum or the like on the surface of each of rare earth metal-based permanent magnets at a high quality in respect of a corrosion resistance and the like and at a low cost, wherein the damaging of and the production of projections on the deposited film of aluminum can be inhibited.

The present inventors have made various reviews with the foregoing in view and as a result, they have found that the damaging of the deposited film of aluminum formed on the surface of each of the rare earth metal-based permanent magnets and the production of projections on the deposited film are directly caused mainly by the collision of the magnets against one another and the rubbing between the magnets and the barrel during the deposited-film forming step. More specifically, in the deposited-film forming apparatus shown in FIG. 9, the distance between the cylindrical barrel and the evaporating section is not varied. For this reason, the rare earth metal-based permanent magnets are always stirred in a fixed area near to the evaporating section and heated by a radiant heat from the evaporating section. Thus, the deposited film of aluminum formed on the surface of each of the magnets is softened by a rise in temperature of the magnets due to the above fact, whereby the deposited film is liable to be damaged or shaved off to provide shavings, which are liable to be deposited on another portion of the film.

The present invention has been accomplished based on the above knowledge, and to achieve the above object, according to a first aspect and feature of the present invention, there is provided a deposited-film forming apparatus comprising an evaporating section for a depositing material, and a tubular barrel formed of a mesh net for accommodation of work pieces, on each of the surfaces of which a depositing material is to be deposited, the evaporating section and the tubular barrel being mounted in a vacuum-treating chamber, wherein the tubular barrel is supported circumferentially outside a horizontal rotational axis of a support member rotatable about the rotational axis, for rotation about the rotational axis, so that the distance between the tubular barrel rotated about the rotational axis of the support member and the evaporating section can be varied by rotating the support member.

According to a second aspect and feature of the present invention, in addition to the first feature, a plurality of the tubular barrels are supported in an annular shape circumferentially outside the rotational axis of the support member.

According to a third aspect and feature of the present invention, in addition to the first feature, the tubular barrel is detachably supported on the support member.

According to a fourth aspect and feature of the present invention, there is provided a deposited-film forming apparatus comprising an evaporating section for a depositing material, and a tubular barrel rotatable about a horizontal rotational axis and formed of a mesh net for accommodation of work pieces, on each of the surfaces of which a depositing material is to be deposited, the evaporating section and the tubular barrel being mounted in a vacuum-treating chamber, wherein the inside of the tubular barrel is divided into two or more accommodating sections, the accommodating sections being defined, so that the distance between the accommodating section and the evaporating section can be varied by rotating the tubular barrel.

According to a fifth aspect and feature of the present invention, in addition to the fourth feature, the inside of the tubular barrel is divided radiately from a rotational axis into two or more accommodating sections.

According to a sixth aspect and feature of the present invention, there is provided a process for forming a deposited film using a deposited-film forming apparatus according to the first or fourth feature.

According to a seventh aspect and feature of the present invention, in addition to the sixth feature, the work piece is a rare earth metal-based permanent magnet.

According to a eighth aspect and feature of the present invention, in addition to the sixth feature, the depositing material is at least one material selected from the group consisting of aluminum, zinc, tin and magnesium and an alloy containing at least one of these metal components.

With the deposited-film forming apparatus according to the first feature of the present invention (a first embodiment of the present invention), the distance between the tubular barrel and the evaporating section can be varied, unlike the prior art deposited-film forming apparatus and hence, the efficient formation of the deposited film on the surface of each of the work pieces accommodated in the tubular barrel and the inhibition of the softening of the formed film can be achieved simultaneously. Therefore, it is possible to inhibit the damaging of the deposited film formed on the surface of each of the work pieces and the production of projections on the deposited film, and to form a deposited film at a high quality in respect of a corrosion resistance and the like and at low cost.

With the deposited-film forming apparatus according to the fourth feature of the present invention (a second embodiment of the present invention), the distance between the accommodating section defined in the tubular barrel and the evaporating section can be varied and hence, this deposited-film forming apparatus also exhibits an effect similar to that in the deposited-film forming apparatus according to the first feature of the present invention.

The above and other objects, features and advantages of the invention will become apparent from the following description of the preferred embodiment taken in conjunction with the accompanying drawings.

DETAILED DESCRIPTION OF THE INVENTION

The present invention will now be described by way of embodiments with reference to the accompanying drawings.

A typical example of a work piece on which a deposited-film is formed in a deposited-film forming apparatus according to the present invention, is a rare earth metal-based permanent magnet. This is because the deposited-film forming apparatus according to the present invention is particularly suitable for such a magnet in respect of that a corrosion-resistant film of a high quality can be formed on a surface of the magnet without occurrence of cracking and breaking of the magnet. However, the work piece is not limited to the rare earth metal-based permanent magnet, and may be any piece on which a deposited film can be formed.

The deposited-film forming apparatus according to the present invention is utilized for formation of a deposited film using a depositing material such as a metal and an alloy, and among others, a soft metal or an alloy containing a soft metal component(s), e.g., aluminum, zinc, tin, magnesium, or an alloy containing at least one of these metal components. Particularly, aluminum used as the depositing material is suitable when a work piece is a rare earth metal-based permanent magnet requiring a strong adhesive strength, because a formed film of aluminum is excellent in corrosion resistance and in addition, excellent in reliability of adhesion with an adhesive required in the incorporation of parts (a peel-off is difficult to occur between the film and the adhesive before an breaking strength essentially possessed by the adhesive is reached). A film formed using any of these depositing material contributes to an enhancement in corrosion resistance of a work piece, either as it is, or when it has another film formed on a surface thereof.

The deposited-film forming apparatus according to the present invention can be used as an apparatus for forming a deposited film by any of all forming technologies, but can exhibit a high effect, when a deposited film is formed by a resistance heating technology which is attended with a large radiant heat from an evaporating section for a depositing material, and which is employed in a vacuum vapor deposition process, an ion plating process and the like. Especially, in a technology in which a depositing material is continuously supplied to an evaporating section heated by supplying of electric current, where it is molten, it is necessary to heat the entire evaporating section to a higher temperature. As a result, the radiant heat from the evaporating section is very large and hence, the apparatus exhibits a high effect in such a technology.

A deposited-film forming apparatus according to a first embodiment of the present invention will be described below. This deposited-film forming apparatus includes an evaporating section for a depositing material, and a tubular barrel formed of a mesh net for accommodation of work pieces, on each of the surfaces of which a depositing material is to be deposited. The evaporating section and the tubular barrel are mounted in a vacuum-treating chamber. The tubular barrel is supported circumferentially outside a horizontal rotational axis of a support member rotatable about the rotational axis, for rotation about the rotational axis, so that the distance between the tubular barrel rotated about the rotational axis of the support member and the evaporating section can be varied by rotating the support member. The outline of one example of the deposited-film forming apparatus (an apparatus for forming a deposited film of aluminum on the surface of each of rare earth metal-based permanent magnets) will be described below with the drawings.

Figure 1:
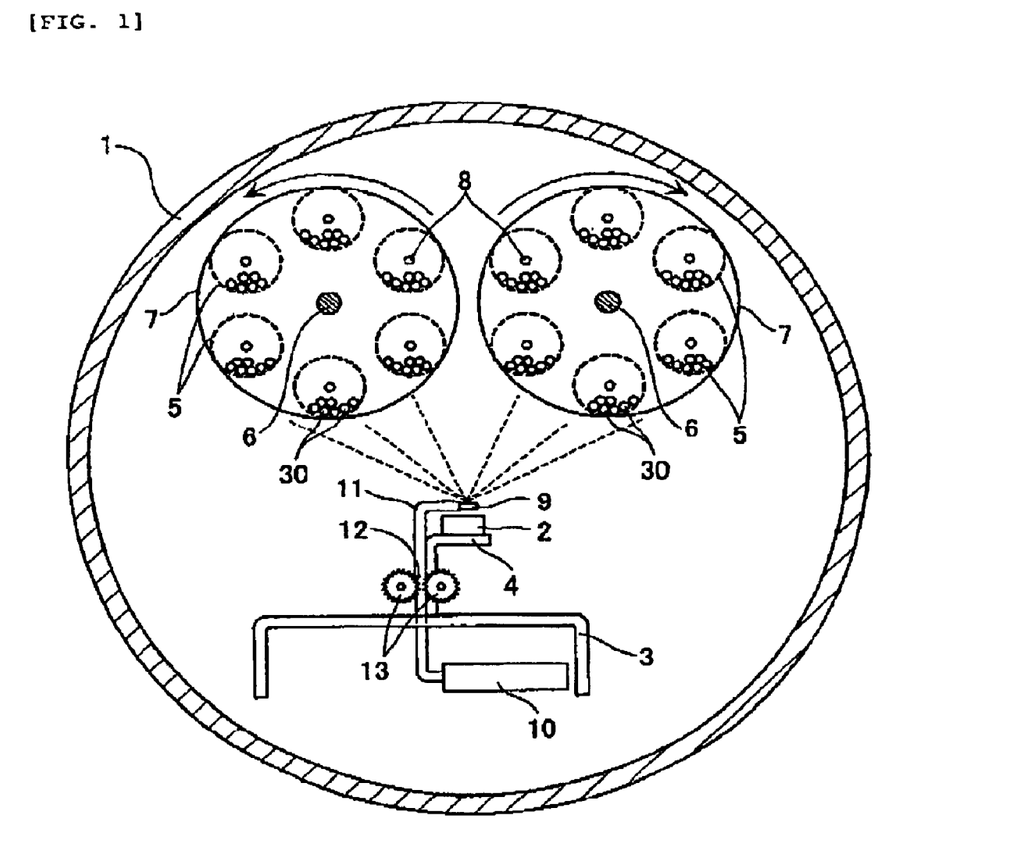
FIG. 1 is a diagrammatic front view (a partially perspective view) of the inside of a vacuum-treating chamber in one example of a deposited-film forming apparatus according to a first embodiment of the present invention.

FIG. 1 is a diagrammatic front view (a partially perspective view) of the inside of a vacuum-treating chamber 1 connected to an evacuating system (not shown).

Two support members 7 rotatable about a rotary shaft 6 on a horizontal rotational axis are disposed side-by-side in an upper area in the chamber. Six cylindrical barrels 5 formed of a mesh net of a stainless steel are supported in an annular shape circumferentially outside the rotary shaft 6 of the support member 7 by support shaft 8 for rotation about the rotary shaft 6. A plurality of boats 2, which are evaporating sections for evaporating aluminum as a depositing material, are disposed on a boat support base 4 risen on a support table 3 in a lower area in the chamber.

An aluminum wire 9, which is a depositing material, is retained and wound around a feed reel 10 below the support table 3. A proceeding end of the aluminum wire 9 is guided to above the boat 2 by a thermal resistant protective tube 11 facing toward an inner surface of the boat 2. A notched window 12 is provided in a portion of the protective tube 11, and feeding gears 13 are mounted in correspondence to the notched window 12 to come into direct contact with the aluminum wire 9, so that aluminum is constantly supplied into the boat 2 by feeding the aluminum wire 9.

Figure 2:
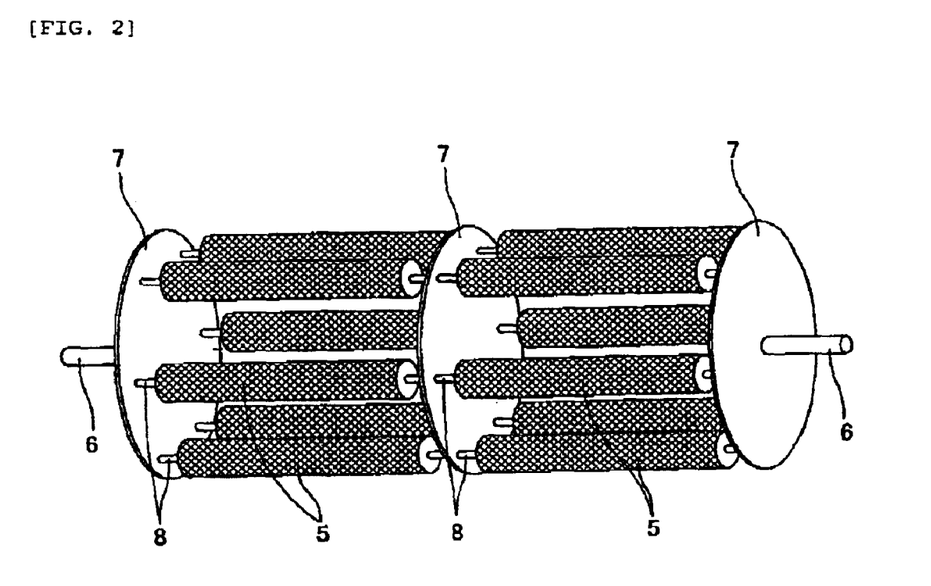
FIG. 2 is a diagrammatic perspective view showing one embodiment with cylindrical barrels supported on support members in one example of the apparatus.

FIG. 2 is a diagrammatic perspective view showing the six cylindrical barrels 5 formed of the mesh net of a stainless steel and supported in the annular shape circumferentially outside the rotary shaft 6 on the horizontal rotational axis of the support member 7 by the support shaft 8 for rotation about the rotary shaft 6, so that they can be rotated about the rotary shaft 6 (the cylindrical barrels are supported in two series and hence, the total number of the cylindrical barrels supported is twelve) (magnets are still not accommodated).

When the support member 7 is rotated about the rotary shaft 6 (see an arrow in FIG. 1), the cylindrical barrel 5 supported by the support shaft 8 circumferentially outside the rotary shaft 6 of the support member 7 is rotated about the rotary shaft 6 in response to the rotation of the support member 7. As a result, the distance between the individual barrel and the evaporating section disposed below the support member is varied, whereby an effect is provided, which will be described below.

The cylindrical barrel located at a lower portion of the support member 7 is close to the evaporating section. Therefore, a deposited film of aluminum is formed with a good efficiency on a surface of each of rare earth metal-based permanent magnets 30 accommodated in this cylindrical barrel. On the other hand, rare earth metal-based permanent magnets accommodated in the cylindrical barrel moved away from the evaporating section are released from the heating and cooled by an amount corresponding to a distance from the evaporating section. Therefore, during this time, the softening of a deposited film of aluminum formed on a surface of each of the magnets is inhibited. In this way, if this deposited-film forming apparatus is used, the efficient formation of the deposited film of aluminum and the inhibition of the softening of the formed film of aluminum can be achieved simultaneously.

Figure 3:
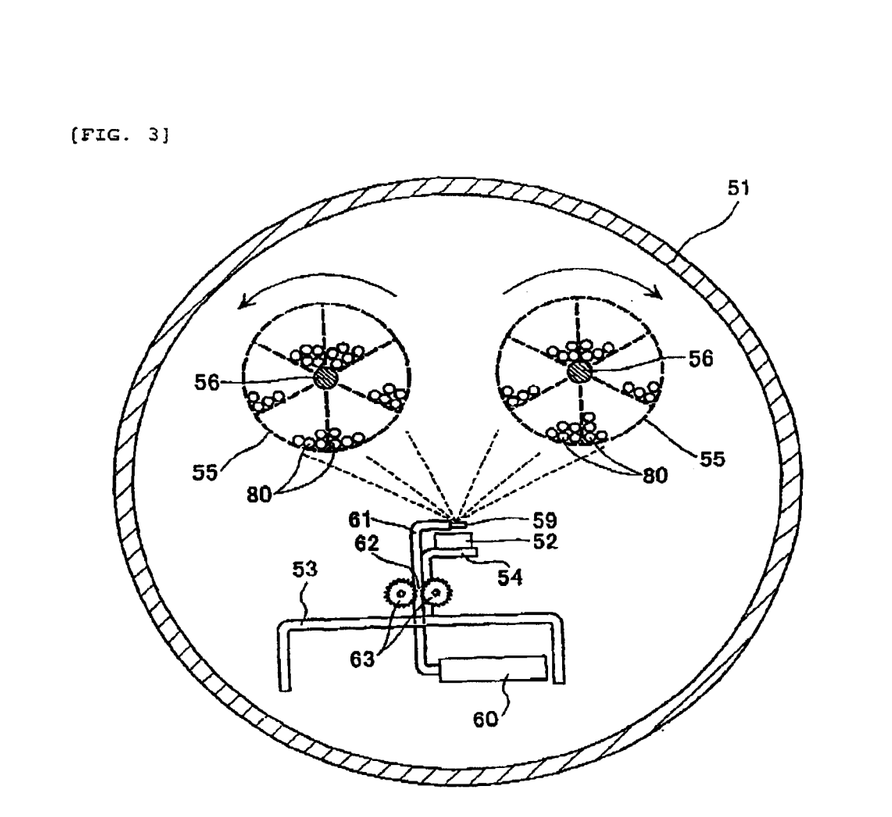
FIG. 3 is a diagrammatic perspective view showing another embodiment with cylindrical barrels supported on other support members in one example of the apparatus.

FIG. 3 is a diagrammatic perspective view showing an embodiment other than the embodiment in which the cylindrical barrels are supported on the support member shown in FIG. 2. Six cylindrical barrels 35 formed of a mesh net of a stainless steel are support in an annular shape circumferentially outside a rotary shaft 36 on a horizontal rotational axis of a support member 37 by a support shaft 38 for rotation about the rotary shaft 36, so that they can be rotated about the rotary shaft 36 (the cylindrical barrels are supported in two series and hence, the total number of the cylindrical barrels supported is twelve) (magnets are still not accommodated).

Figure 4:
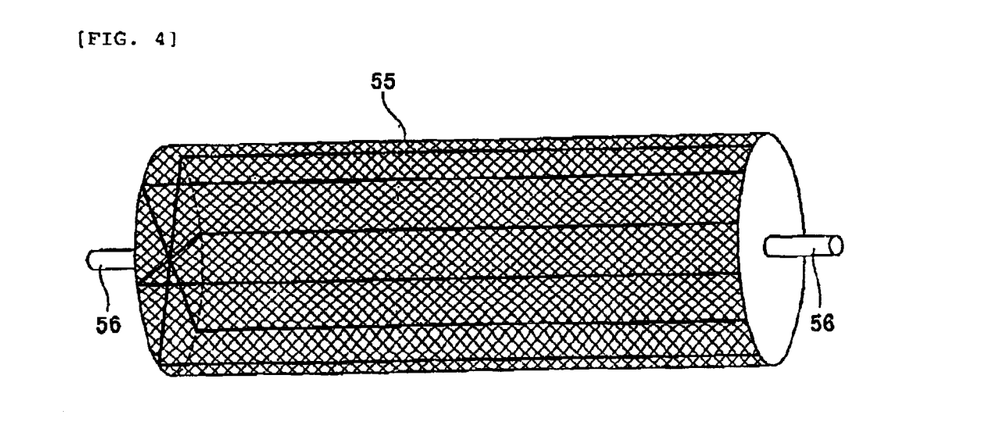
FIG. 4 is a diagrammatic perspective view of the cylindrical barrel used in the embodiment shown in FIG. 3.

FIG. 4 is a diagrammatic perspective view of the cylindrical barrel 35 used in the embodiment shown in FIG. 3. The cylindrical barrel 35 is capable of being opened and closed in a longitudinal direction and comprises an upper cage portion 35a and a lower cage portion 35b formed as symmetrical elements capable of being opened and closed through a hinge (not shown). The cylindrical barrel 35 has a support shaft 38 for being supportedby the support member 37. If such a cylindrical barrel 35 is used, it is possible to easily conduct the placing and removal of rare earth metal-based permanent magnets into and out of the cylindrical barrel 35 and hence, it is possible to inhibit the occurrence of the cracking and breaking of the magnets during the placing and removal of the magnets into and out of the cylindrical barrel 35. When such a cylindrical barrel is continuously used many times, there is a possibility that the mesh forming the barrel may be deformed by an influence of a thermal history attendant on the depositing treatment, whereby a gap may be created between the upper and lower cage portions 35a and 35b, and magnets are dropped out through such gap. Therefore, it is desirable that a work piece dropout preventing plate 39 is mounted longitudinally in an opening in the lower cage portion 35b. Alternatively, the work piece dropout preventing plate may be mounted longitudinally in an opening in the upper cage portion 35a. During the depositing treatment, the upper and lower cage portions 35a and 35b are fastened to each other by a clip (not shown). In addition, net-shaped or plate-shaped dividing walls may be provided vertically in the longitudinal direction within the cylindrical barrel 35, so that one rare earth metal-based permanent magnet may be accommodated in each of partitioned chamber portions defined by the dividing walls, whereby the rare earth metal-based permanent magnets may be subjected in spaced-apart states to a depositing treatment.

Figure 5:
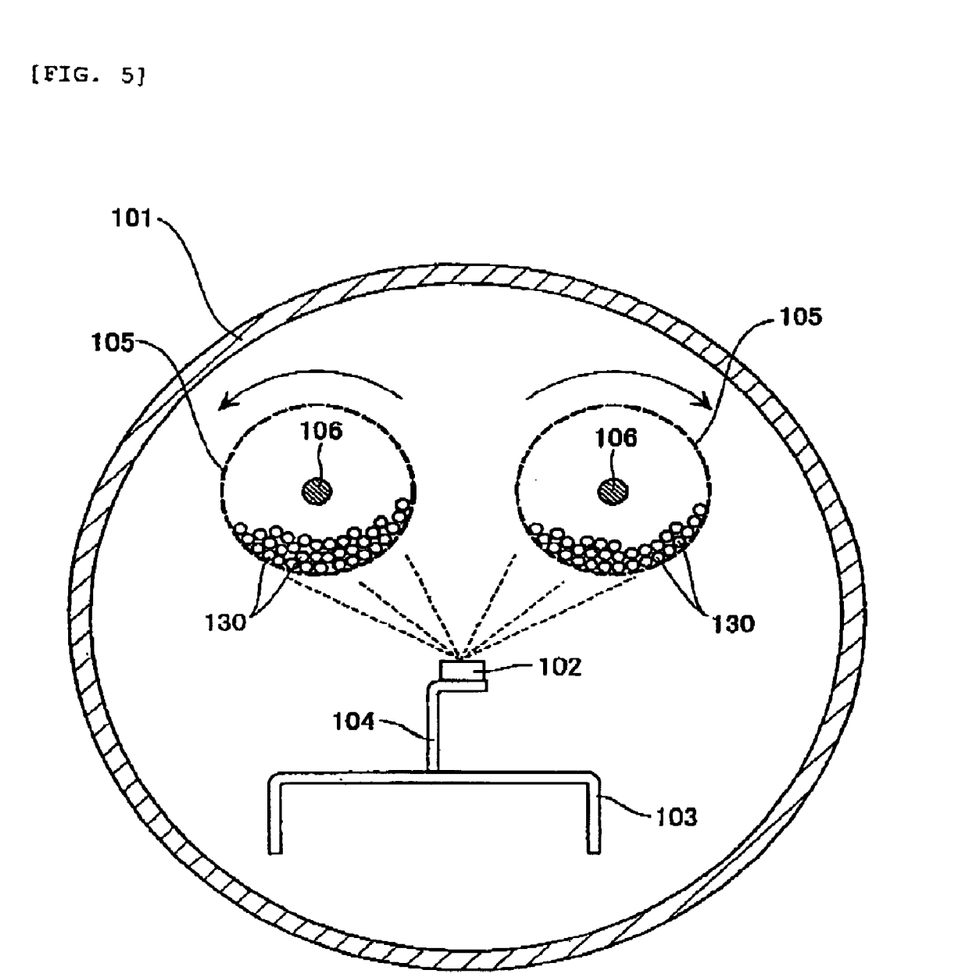
FIG. 5 is a diagrammatic partially front view showing how the cylindrical barrel is supported on the support member in the embodiment shown in FIG. 3.

FIG. 5 is a diagrammatic partially front view showing how the cylindrical barrel 35 is supported on the support member 37 in the embodiment shown in FIG. 3. The cylindrical barrel 35 is supported by clamping the support shaft 38 in the support member 37. It is desirable that the clamping of the support shaft 38 in the support member 37 is resiliently conducted, for example, as in a mechanism utilizing a repulsive force of a spring, so that the cylindrical barrel 35 is detachably supported on the support member 37.

The deposited-film forming apparatus according to the first embodiment of the present invention shown in FIG. 1 is advantageous in respect of that it exhibits the above-described effect and has advantages which will be described below.

Even when a mass treatment is carried out, it is advantageous that magnets are placed in a smaller amount into each of the cylindrical barrels in this deposited-film forming apparatus, rather than in a larger amount into a single cylindrical barrel in the prior art deposited-film forming apparatus. In this case, the frequency of collision of the magnets against one another within the barrel can be reduced, and the collision energy can be reduced and hence, it is possible to inhibit the cracking and breaking of the magnets.

When work pieces such as bow-shaped magnets or large-sized magnets are placed into a cylindrical barrel having a large radius R of curvature in the prior art deposited-film forming apparatus, where they are subjected to a depositing treatment, the following phenomenon is liable to be generated: the magnets are slipped down along the inner surface of the barrel, whereby only one side of each of the magnets always faces the evaporating section. However, if even such magnets are placed into the cylindrical barrel having a smaller radius R of curvature than that the barrel in the prior art in this deposited-film forming apparatus, where they are subjected to the depositing treatment, the stirring of the magnets can be conducted homogeneously and hence, the formation of consistent films with a less difference in thickness can be achieved.

In addition, magnets having different shapes or magnets having different sizes can be accommodated in each of the cylindrical barrels, respectively, and the cylindrical barrels are fixed in an annular shape circumferentially outside the rotational axis of the support member to carry out the depositing treatment. Therefore, the depositing treatments of a plurality of types of magnets can be carried out at one time.

A plurality of cylindrical barrels having different mesh shapes are used in combination with one another and fixed in an annular shape circumferentially outside the rotational axis of the support member to carry out the depositing treatment, whereby the depositing efficiency can be varied for every cylindrical barrels. Therefore, it is possible to form deposited films having different thickness values on magnets accommodated in every cylindrical barrels.

In the prior art, for the purpose of the reduction of the frequency of collision of the magnets against one another within the barrel, dummies (e.g., ceramic balls having a diameter of 10 mm) accommodated along with magnets in the barrel may be used in some cases. However, the use of this deposited-film forming apparatus eliminates the need for use of the dummies, and can enhance the efficiency of the formation of deposited films on the magnets. This provides effects such as the inhibition of a rise in temperature of the magnets, the inhibition of the damaging of the deposited films and the inhibition of the production of projections.

In addition, it is possible to eliminate labor for placing the magnets into a holder for protecting the magnets (for example, a spring-like cylindrical member which is formed by winding a linear material with a gap left and which has spiral faces at opposite ends, so that magnets can be accommodated in the cylindrical member).

By detachably supporting the cylindrical barrel on the support member, advantages are provided, which will be described below.

The placing and removal of the magnets into and out of the barrel can be carried out at any site and hence, it is possible to enhance the convenience and to inhibit the occurrence of the cracking and breaking of the magnets during the placing and removal of the magnets.

There is a possibility that as the frequency of continuous service of the cylindrical barrel is increased, the depositing material is preferentially deposited onto the mesh surface facing the evaporating section for the depositing material, and the opening rate of the mesh is gradually decreased with this deposition, or the opening and closing of the barrel are made difficult by the deposition of the depositing material on the opening/closing portion of the barrel. Therefore, it is desirable that the cylindrical barrel is washed properly by an alkali aqueous solution such as an aqueous solution of sodium hydroxide to dissolve off the deposited depositing material. By detachably supporting the cylindrical barrel on the support member and further providing a means for ensuring that the mesh surface facing the evaporating section can be changed to the other mesh surface, the following effects are provided: If the cylindrical barrel is detachably supported on the support member, and for example, the support shaft is formed into a polygonal or an oval in section, it is ensured that when the cylindrical barrel once removed from the support member is fixed again to the support member, the mesh surface which has not faced the evaporating section can be fixed to face the evaporating section. Therefore, the deposition of the depositing material on the mesh surface can be dispersed and hence, it is possible to decrease the number of runs of an operation for removing depositing material using the alkali aqueous solution. For example, if the support shaft is formed as a plate-shaped member, as shown in FIGS. 3 to 5, the cylindrical barrel can be removed from the support member at a time point when the deposition of the depositing material on one mesh surface has been advanced, and such cylindrical barrel can be fixed again to the support member, so that the mesh surface, which has faced the evaporating section and has the depositing material deposited thereon to an advanced extent, faces inwards the support member (i.e., with the cylindrical barrel shown in FIGS. 3 to 5, in a direction toward the center and opposite from the evaporating section located outside the support member), and the mesh surface having a smaller amount of the depositing material deposited thereon faces the evaporating section (i.e., with the cylindrical barrel shown in FIGS. 3 to 5, the cylindrical barrel is fixed, turned through 180 degrees in parallel to the rotational axis), and in this state, the depositing treatment can be carried out. Therefore, the above-described effects are provided.

Further, the cylindrical barrel can be formed at a size ensuring that the cylindrical barrel is easy to handle and thus, one barrel can be consistently used at the deposited-film forming step and at preceding and succeeding steps (for example, the preceding step may be a blast treatment, and the succeeding step may be a peening treatment and a subsequent chemical conversion film forming treatment). Therefore, the need for carrying out an operation for transferring the magnets between the steps is eliminated and hence, it is possible to inhibit the occurrence of the cracking and breaking of the magnets, which may be caused during transferring of the magnets and in addition, to eliminate labor for the transferring operation.

In the deposited-film forming apparatus shown in FIGS. 1 and 2, the support member 7 for supporting the cylindrical barrel 5 is disposed in the upper area in the vacuum-treating chamber 1. The boat 2, which is the evaporating section, is disposed in the lower area in the chamber 1, but the positional relationship between the support member and the evaporating section is not limited to the above relationship. The support member and the evaporating section may be disposed at any locations, if they are in a positional relationship ensuring that the distance between the cylindrical barrel and the evaporating section can be varied by rotating the support member. However, if the evaporating section is disposed outside the support member, the distance between the support member and the evaporating section can be set in a wide range within the internal space in the vacuum-treating chamber. Therefore, it is possible to easily set a distance desirable for efficiently forming a deposited film and inhibiting the softening of the formed deposited film. In addition, even when the depositing material is evaporated while being molten to conduct the formation of a deposited film, each of the members or components can be easily disposed and is excellent in handleability.

In addition, in the deposited-film forming apparatus shown in FIGS. 1 and 2, the six cylindrical barrels 5 are supported on one surface of one of the support members 7 (the cylindrical barrels are supported in two series and hence, the total number of the cylindrical barrels supported is twelve), but the number of the cylindrical barrels supported on one of the support members is not limited to six and may be one.

The cylindrical barrel 5 may be supported, so that by rotating the support member 7, it can be rotated about the rotary shaft 6 of the support member 7 and can be also rotated about its axis by a known mechanism.

The shape of the barrel is not limited to the cylindrical shape, and the barrel may be polygonal in section such as hexagonal and octagonal, if it is tubular.

The cylindrical barrel 5 may be detachable from the support member 7, and the support member 7 may be removable from the vacuum-treating chamber 1.

Examples of the mesh net include those made of a stainless steel and titanium. The reason why a desirable material for the mesh net is a stainless steel and titanium is that these materials are excellent in strength and in durability to an alkali aqueous solution used for the operation for removing the depositing material deposited on the barrel. The mesh net may be made using a net-shaped plate produced by punching or etching a flat plate, or may be made by knitting a linear material.

The opening rate of the mesh (the proportion of the area of an opening to the area of the mesh) depends on the shape and the size of a work piece, but is desirably in a range of 50% to 95%, more desirably in a range of 60% to 85%. If the opening rate is smaller than 50%, there is a possibility that the mesh itself is an obstacle between the evaporating section and the work piece, resulting in a reduced depositing efficiency. If the opening rate is larger than 95%, there is a possibility that the mesh is deformed or damaged during the depositing treatment or during another handling. The wire diameter of the mesh is selected in consideration of the opening rate and the strength, and is generally desirable to be in a range of 0.1 mm to 10 mm. Further, if the handling ease is taken into consideration, the wire diameter of the mesh is desirable to be in a range of 0.3 mm to 5 mm. With the deposited-film forming apparatus according to the first embodiment of the present invention, magnets may be placed in a smaller amount into each of the cylindrical barrels in a mass treatment, rather than in a larger amount into the single cylindrical barrel in the prior art deposited-film forming apparatus. In this case, the load applied to the mesh is smaller and hence, the deformation of the mesh is difficult to occur. Therefore, the wire diameter of the mesh can be reduced to increase the opening rate and hence, it is possible to enhance the depositing efficiency.

A deposited-film forming apparatus according to a second embodiment of the present invention will be described below. This deposited-film forming apparatus includes an evaporating section for a depositing material, and a tubular barrel rotatable about a horizontal rotational axis and formed of a mesh net for accommodation of work pieces, on each of the surfaces of which a depositing material is to be deposited. The evaporating section and the tubular barrel are mounted in a vacuum-treating chamber. The inside of the tubular barrel is divided into two or more accommodating sections. The accommodating sections are defined, so that the distance between the accommodating section and the evaporating section can be varied by rotating the tubular barrel. The outline of one example of the deposited-film forming apparatus (an apparatus for forming a deposited film of aluminum on the surface of each of rare earth metal-based permanent magnets) will be described below with the drawings.

Figure 6:
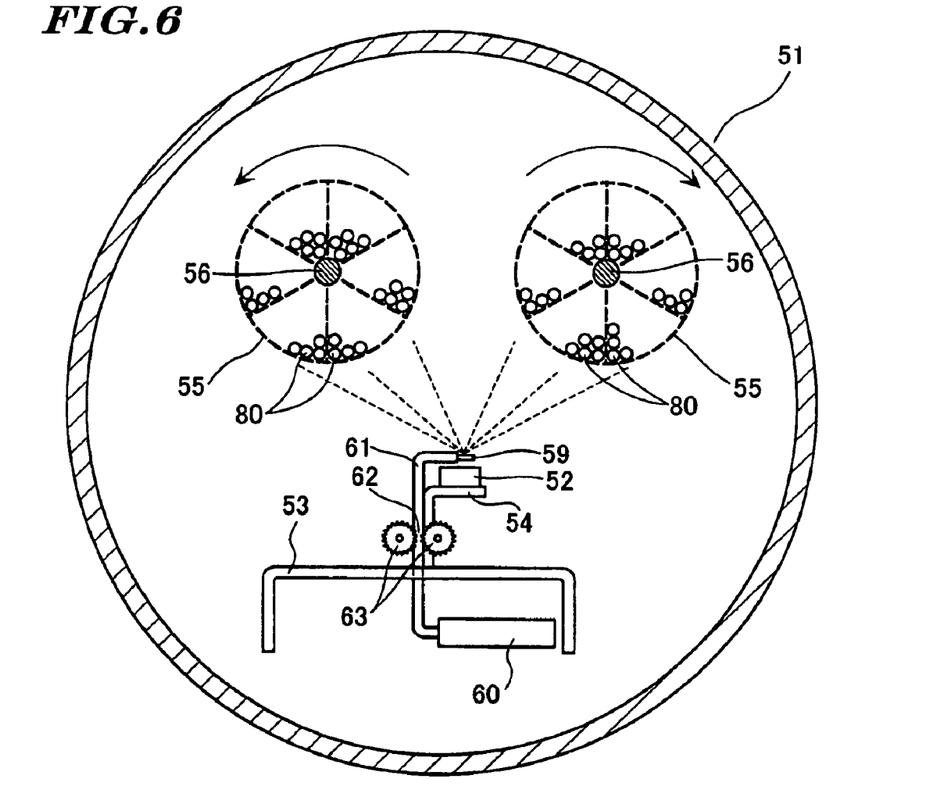
FIG. 6 is a diagrammatic front view (a partially perspective view) of the inside of a vacuum-treating chamber in one example of a deposited-film forming apparatus according to a second embodiment of the present invention.

FIG. 6 is a diagrammatic front view (a partially perspective view) of the inside of a vacuum-treating chamber 51 connected to an evacuating system (not shown).

Two cylindrical barrels 55 formed of a mesh net of a stainless steel are disposed side-by-side in an upper area in the chamber for rotation about a rotary shaft 56 on a horizontal rotational axis. The inside of the cylindrical barrel 55 is divided radiately from a rotational axis into six accommodating sections fan-shaped in section. A plurality of boats 52, which are evaporating sections for evaporating aluminum as a depositing material, are disposed on a boat support base 54 risen on a support table 53 in a lower area in the chamber.

An aluminum wire 59, which is a depositing material, is retained and wound around a feed reel 60 below the support table 53. A proceeding end of the aluminum wire 59 is guided to above the boat 52 by a thermal resistant protective tube 61 facing toward an inner surface of the boat 52. A notched window 62 is provided in a portion of the protective tube 61, and feeding gears 63 are mounted in correspondence to the notched window 62 to come into direct contact with the aluminum wire 59, so that aluminum is constantly supplied into the boat 52 by feeding the aluminum wire 59.

Figure 7:
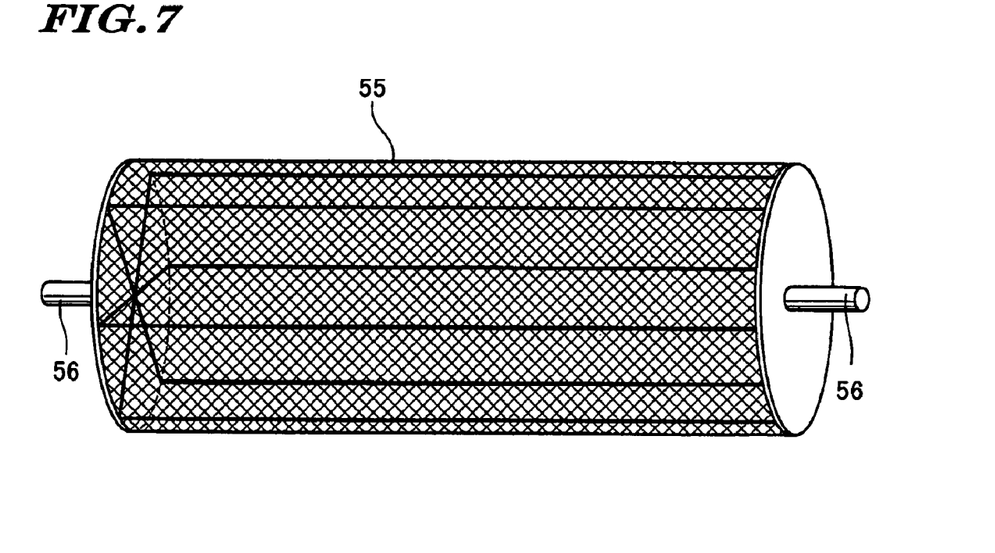
FIG. 7 is a diagrammatic perspective view of the cylindrical barrel whose inside is divided in one example of the apparatus.

FIG. 7 is a diagrammatic perspective view of the cylindrical barrel 55 rotatable about the rotary shaft 56 on the horizontal rotational axis and formed of a mesh net of a stainless steel, the inside of which is divided radiately from the rotational axis into the six accommodating sections fan-shaped in section (magnets are still not accommodated).

When the cylindrical barrel 55 is rotated about the rotary shaft 56 (see an arrow in FIG. 6), the distance between the individual accommodating section defined in the cylindrical barrel and the evaporating section disposed below the accommodating sections is varied, whereby an effect is provided, which will be described below.

The accommodating section located at a lower portion of the cylindrical barrel 55 is close to the evaporating section. Therefore, a deposited film of aluminum is formed with a good efficiency on a surface of each of rare earth metal-based permanent magnets 80 accommodated in this accommodating section. On the other hand, rare earth metal-based permanent magnets accommodated in the accommodating section moved away from the evaporating section are released from the heating and cooled by an amount corresponding to a distance from the evaporating section. Therefore, during this time, the softening of a deposited film of aluminum formed on a surface of each of the magnets is inhibited. In this way, if this deposited-film forming apparatus is used, the efficient formation of the deposited film of aluminum and the inhibition of the softening of the formed film of aluminum can be achieved simultaneously.

The deposited-film forming apparatus according to the second embodiment of the present invention shown in FIG.

6 is advantageous in respect of that it exhibits the above-described effect and has advantages which will be described below.

Even when a mass treatment is carried out, it is advantageous that magnets are placed in a smaller amount into each of the accommodating sections in this deposited-film forming apparatus, rather than in a larger amount into a cylindrical barrel in the prior art deposited-film forming apparatus. In this case, the frequency of collision of the magnets against one another within the barrel can be reduced, and the collision energy can be reduced and hence, it is possible to inhibit the cracking and breaking of the magnets.

In the prior art, for the purpose of the reduction of the frequency of collision of the magnets against one another within the barrel, dummies (e.g., ceramic balls having a diameter of 10 mm) accommodated along with magnets in the barrel may be used in some cases. However, the use of this deposited-film forming apparatus eliminates the need for use of the dummies, and can enhance the efficiency of the formation of deposited films on the magnets. This provides effects such as the inhibition of a rise in temperature of the magnets, the inhibition of the damaging of the deposited films and the inhibition of the production of projections.

In addition, it is possible to eliminate labor for placing the magnets into a holder for protecting the magnets (for example, a spring-like cylindrical member which is formed by winding a linear material with a gap left and which has spiral faces at opposite ends, so that magnets can be accommodated in the cylindrical member).

In the deposited-film forming apparatus shown in FIGS. 6 and 7, the cylindrical barrel 55 is disposed in the upper area in the vacuum-treating chamber 51, and the inside of the cylindrical barrel 55 is divided radiately from the rotational axis into the six accommodating sections fan-shaped in section. The boat 52, which is the evaporating section, is disposed in the lower area in the chamber 51. The positional relationship between the cylindrical barrel and the evaporating section is not limited to the above relationship. The cylindrical barrel and the evaporating section may be disposed at any locations, if they are in a positional relationship ensuring that the distance between the accommodating section and the evaporating section can be varied by rotating the cylindrical barrel.

In the deposited-film forming apparatus shown in FIGS. 6 and 7, the inside of the cylindrical barrel 55 is divided radiately from the rotational axis into the six accommodating sections fan-shaped in section, but the accommodating sections may be defined in the cylindrical barrel in any dividing manner, if the distance between the accommodating section and the evaporating section can be varied by rotating the cylindrical barrel. Each of partitions defining the accommodating sections may be a net-shaped partition or a plate-shaped partition. Net-shaped or plate-shaped dividing walls may be provided vertically in the longitudinal direction within each of the accommodating sections, so that one rare earth metal-based permanent magnet may be accommodated in each of partitioned chamber portions defined by the dividing walls, whereby the rare earth metal-based permanent magnets may be subjected in spaced-apart states to a depositing treatment.

The shape of the barrel is not limited to the cylindrical shape, and the barrel may be polygonal in section such as hexagonal and octagonal, if it is tubular.

The cylindrical barrel 55 may be detachable from the vacuum-treating chamber 51.

Examples of the mesh net include those made of a stainless steel and titanium. The reason why a desirable material for the mesh net is a stainless steel and titanium is that these materials are excellent in strength and in durability to an alkali aqueous solution used for the operation for removing the depositing material deposited on the barrel. The mesh net may be made using a net-shaped plate produced by punching or etching a flat plate, or may be made by knitting a linear material.

The opening rate of the mesh (the proportion of the area of an opening to the area of the mesh) depends on the shape and the size of a work piece, but is desirably in a range of 50% to 95%, more desirably in a range of 60% to 85%. If the opening rate is smaller than 50%, there is a possibility that the mesh itself is an obstacle between the evaporating section and the work piece, resulting in a reduced depositing efficiency. If the opening rate is larger than 95%, there is a possibility that the mesh is deformed or damaged during the depositing treatment or during another handling. The wire diameter of the mesh is selected in consideration of the opening rate and the strength, and is generally desirable to be in a range of 0.1 mm to 10 mm. Further, if the handling ease is taken into consideration, the wire diameter of the mesh is desirable to be in a range of 0.3 mm to 5 mm.

EXAMPLES

The deposited-film forming apparatus according to the present invention will be further described in detail by comparison of the following examples with comparative examples. The deposited-film forming apparatus according to the present invention is not limited to such examples. The following examples and comparative examples were carried out using sintered magnets of various shapes having a composition of 14Nd—79Fe—6B—1Co and produced by pulverizing a known cast ingot and then subjecting the resulting powder to a pressing, a sintering, a heat treatment and a surface working, for example, as described in U.S. Pat. Nos. 4,770,723 and 4,792,368 (such sintered magnets will be referred to as magnet test pieces hereinafter).

Example 1

The following experiment was carried out using the deposited-film forming apparatus shown in FIGS. 1 and 2. The cylindrical barrel used in this experiment was made of a stainless steel at a diameter of 110 mm and a length of 530 mm and had an opening rate of a mesh of 79.4% (an opening was square with a length of one side equal to 9.0 mm and with a wire diameter of 1.1 mm). The six cylindrical barrels were detachably supported on one support member (the total number of the cylindrical barrels supported in two series was twelve).

Each of the magnet test pieces having dimensions of 30 mm×15 mm×6 mm was subjected to a shot blasting, whereby an oxide layer formed on a surface of each of the magnet test pieces by a surface treatment at a preceding step was removed. Sixty-nine magnet test pieces (five of which were magnets on each of which Thermo Label (which is a trade name and made by Nichiyu Giken Kogyo Co., Ltd) adhered to an aluminum foil was rounded with the Thermo Label turned inside) were placed into each of the twelve cylindrical barrels. Therefore, a total of 828 magnet test pieces were accommodated in the twelve cylindrical barrels, and then, the cylindrical barrels were fixed to the support members. The vacuum-treating chamber was evacuated under $1\times10^{-3}$ Pa, and the magnet test pieces were then subjected to a spattering for 20 minutes under conditions of an argon (Ar) gas pressure of 1 Pa and a bias voltage of −500 V, while rotating the support members at 1.5 rpm, whereby the surfaces of the magnet test pieces were cleaned. Subsequently, an aluminum wire used as a depositing material was heated and evaporated for ionization under conditions of an Ar gas pressure of 1 Pa and a bias voltage of −100 V, whereby a deposited film of aluminum was formed on a surface of each of the magnet test pieces for 12 minutes by an ion plating process. An average highest temperature of the magnet test pieces having the Thermo Label adhered thereto was measured and as a result, it was 170° C.

The magnet test pieces were left to cool and then, examined for the damaging of the deposited film of aluminum formed on each of their surfaces, for the production of projections on the deposited film and for the cracking and breaking of the magnet test pieces themselves. A thickness of the deposited film of aluminum on each of the magnet test pieces (except the magnet test pieces having portions exposed due to the damaging, the projections or the cracking and breaking) was measured using a fluorescence X-ray thickness-meter (SFT-7000 made by Seiko Instruments and Electronics, Ltd.). Results (average value of n=10) of the measurement are shown in Table 1.

The cylindrical barrels were mounted to a blasting apparatus with the magnet test pieces each having the deposited film of aluminum on its surface being left accommodated in such cylindrical barrels without being transferred into other barrels. Then, the magnet test pieces were subjected to a shot peening treatment in which spherical glass beads having an average grain size of 120 μm and a Mohs hardness of 6 (a Vickers hardness in a range of 500 to 550) were injected to under an injection pressure of 1.5 kg/cm² for 5 minutes along with a pressurized gas comprising $N_2$ gas. The number of those of the magnet test pieces having the deposited films of aluminum and subjected to the shot peening treatment, whose portions exposed due to the damaging of the deposited films of aluminum, the production of projections on the deposited film or the cracking and breaking of the magnet test pieces themselves (i.e., the defective products) was examined. A result is shown in Table 1.

The magnet test pieces having the deposited film of aluminum (except the magnet test pieces having portions exposed due to the damaging, the projections or the cracking and breaking) were subjected to a corrosion-resistance acceleration test which comprises leaving the magnet test pieces to stand under high-temperature and high-humidity conditions of a temperature of 80° C. and a relative humidity of 90%, and results (n=5) are shown in Table 1.

As apparent from Table 1, it is made clear that by carrying out the formation of the deposited film of aluminum on the surface of each of the magnet test pieces using the deposited-film forming apparatus according to the first embodiment of the present invention, the damaging of the deposited film of aluminum, the production of projections on the deposited film and the cracking and breaking of the magnet test pieces themselves can be inhibited, and an excellent corrosion resistance can be provided to each of the magnet test pieces.

Example 2

The following experiment was carried out using the deposited-film forming apparatus shown in FIGS. 6 and 7. The cylindrical barrel used in this experiment was made of a stainless steel at a diameter of 355 mm and a length of 1,200 mm and had an opening rate of a mesh of 79.4% (an opening was square with a length of one side equal to 9.0 mm and with a wire diameter of 1.1 mm). The inside of the cylindrical barrel was divided radiately from the rotational axis into six accommodating sections fan-shaped in section.

Each of the magnet test pieces having the same dimensions as the magnet test pieces used in Example 1 was subjected to a shot blasting, whereby an oxide layer formed on a surface of each of the magnet test pieces by a surface treatment at a preceding step was removed. 138 Magnet test pieces (five of which were magnets on each of which Thermo Label (which is a trade name and made by Nichiyu Giken Kogyo Co., Ltd) adhered to an aluminum foil was rounded with the Thermo Label turned inside) were placed into each of the accommodating sections of the cylindrical barrel. Therefore, a total of 828 magnet test pieces were accommodated in the entire cylindrical barrel. Thereafter, a deposited film of aluminum was formed on a surface of each of the magnet test pieces in the same manner as in Example 1. An average highest temperature of the magnet test pieces having the Thermo Label adhered thereto was measured and as a result, it was 170° C.

The magnet test pieces were left to cool and then, examined for the damaging of the deposited film of aluminum formed on each of their surfaces, for the production of projections on the deposited film and for the cracking and breaking of the magnet test pieces themselves. A thickness of the deposited film of aluminum on each of the magnet test pieces (except the magnet test pieces having portions exposed due to the damaging, the projections or the cracking and breaking) was measured in the same manner as in Example 1. Results (average value of n=10) of the measurement are shown in Table 1.

The magnet test pieces each having the deposited film of aluminum on the surface thereof were transferred in a tray made of aluminum and then thrown into a blasting apparatus, where they were subjected to a shot peening treatment in the same manner as in Example 1. The magnet test pieces each having the deposited film of aluminum and subjected to the shot peening treatment were examined for the number of defective products. A result is shown in Table 1.

In addition, the magnet test pieces having the deposited film of aluminum (except the magnet test pieces having portions exposed due to the damaging, the projections or the cracking and breaking) were subjected to a corrosion-resistance acceleration test similar to that in Example 1, and results (n=5) are shown in Table 1.

As apparent from Table 1, it is made clear that by carrying out the formation of the deposited film of aluminum on the surface of each of the magnet test pieces using the deposited-film forming apparatus according to the second embodiment of the present invention, the damaging of the deposited film of aluminum, the production of projections on the deposited film and the cracking and breaking of the magnet test pieces themselves can be inhibited, and an excellent corrosion resistance can be provided to each of the magnet test pieces.

Comparative Example 1

The following experiment was carried out using a prior art deposited-film forming apparatus including cylindrical barrel made of a stainless steel at a diameter of 355 mm and a length of 1,200 mm and having an opening rate of a mesh of 79.4% (an opening was square with a length of one side equal to 9.0 mm and with a wire diameter of 1.1 mm) (see FIG. 9, the evaporating section being of the same construction as in the deposited-film forming apparatus shown in FIG. 1).

Each of the magnet test pieces having the same dimensions as the magnet test pieces used in Example 1 was subjected to a shot blasting, whereby an oxide layer formed on a surface of each of the magnet test pieces by a surface treatment at a preceding step was removed. 828 Magnet test pieces (five of which were magnets on each of which Thermo Label (which is a trade name and made by Nichiyu Giken Kogyo Co., Ltd) adhered to an aluminum foil was rounded with the Thermo Label turned inside) were placed into the cylindrical barrel. Thereafter, a deposited film of aluminum was formed on a surface of each of the magnet test pieces in the same manner as in Example 1. An average highest temperature of the magnet test pieces having the Thermo Label adhered thereto was measured and as a result, it was 220° C.

The magnet test pieces were left to cool and then, examined for the damaging of the deposited film of aluminum formed on each of their surfaces, for the production of projections on the deposited film and for the cracking and breaking of the magnet test pieces themselves. A thickness of the deposited film of aluminum on each of the magnet test pieces (except the magnet test pieces having portions exposed due to the damaging, the projections or the cracking and breaking) was measured in the same manner as in Example 1. Results (average value of n=10) of the measurement are shown in Table 1.

The magnet test pieces each having the deposited film of aluminum on the surface thereof were transferred in a tray made of aluminum and then thrown into a blasting apparatus, where they were subjected to a shot peening treatment in the same manner as in Example 1. The magnet test pieces each having the deposited film of aluminum and subjected to the shot peening treatment were examined for the number of defective products. A result is shown in Table 1.

In addition, the magnet test pieces having the deposited film of aluminum (except the magnet test pieces having portions exposed due to the damaging, the projections or the cracking and breaking) were subjected to a corrosion-resistance acceleration test similar to that in Example 1, and results (n=5) are shown in Table 1.

As apparent from Table 1, when the deposited film of aluminum was formed on the surface of each of the magnet test piece using the prior art deposited-film forming apparatus, the number of the defective products was far larger, and the corrosion resistance of the magnet test pieces was poor, as compared with the deposited film of aluminum formed using the deposited-film forming apparatus according to the present invention.

The present inventors have made clear that the hardness of the deposited film of aluminum is reduced with a rise in temperature of the magnet, the above-described results have been construed as being due to a difference in degree of rising of the temperature of the magnet during formation of the film.

TABLE 1

| | Thickness ($\mu$m) | Number of defective products | Result of corrosion-resistance test |
|---|---|---|---|
| Example 1 | 6.8 | 1/828 | All magnets were not rusted even after lapse of 500 hours |
| Example 2 | 6.3 | 3/828 | All magnets were not rusted even after lapse of 500 hours |
| Comparative Example 1 | 7.1 | 17/828 | Three magnets were rusted after lapse of 300 hours |

Example 3

The following experiment was carried out using the deposited-film forming apparatus shown in FIGS. 1 and 2. In this experiment, the cylindrical barrels were detachably supported in two series on the support members. More specifically, the six cylindrical barrels (barrels A) each made of a stainless steel at a diameter of 110 mm and a length of 530 mm and having an opening rate of a mesh of 79.4% (an opening was square with a length of one side equal to 9.0 mm and with a wire diameter of 1.1 mm) were detachably supported on one of the two series, and the six cylindrical barrels (barrels B) each made of a stainless steel at a diameter of 110 mm and a length of 530 mm and having an opening rate of a mesh of 62.0% (an opening was square with a length of one side equal to 4.1 mm and with a wire diameter of 1.1 mm) were detachably supported on the other of the two series.

Sixty-nine magnet test pieces (each resulting from a shot blasting to remove an oxide layer formed on a surface of each of the magnet test pieces by a surface treatment at a preceding step) having the same dimensions as the magnet test pieces used in Example 1 were placed into each of the six barrels A (a total of 414 magnet test pieces were accommodated in the six barrels A), and 500 magnet test pieces having dimensions of 10 mm×8 mm×4 mm (each resulting from a shot blasting to remove an oxide layer formed on a surface of each of the magnet test pieces by a surface treatment at a preceding step) were placed into each of the six barrels B (a total of 3,000 magnet test pieces were accommodated in the six barrels B). The cylindrical barrels were fixed to the support members, and thereafter, a deposited film of aluminum was formed on a surface of each of the magnet test pieces in the same manner as in Example 1.

The magnet test pieces were left to cool and then, examined for the damaging of the deposited film of aluminum formed on each of their surfaces, for the production of projections on the deposited film and for the cracking and breaking of the magnet test pieces themselves. A thickness of the deposited film of aluminum on each of the magnet test pieces (except the magnet test pieces having portions exposed due to the damaging, the projections or the cracking and breaking) was measured in the same manner as in Example 1 (average value of n=10). A result shows that the thickness of the deposited film of aluminum formed on the surface of each of the magnet test pieces placed into the barrels A and subjected to the depositing treatment was 6.9 $\mu$m, and that the thickness of the deposited film of aluminum formed on the surface of each of the magnet test pieces placed into the barrels B and subjected to the depositing treatment was 6.5 $\mu$m. Therefore, it can be seen that the stable depositing treatments of the two types of the magnet test pieces having the different shapes could be carried out at one time.

Example 4

Figure 8:
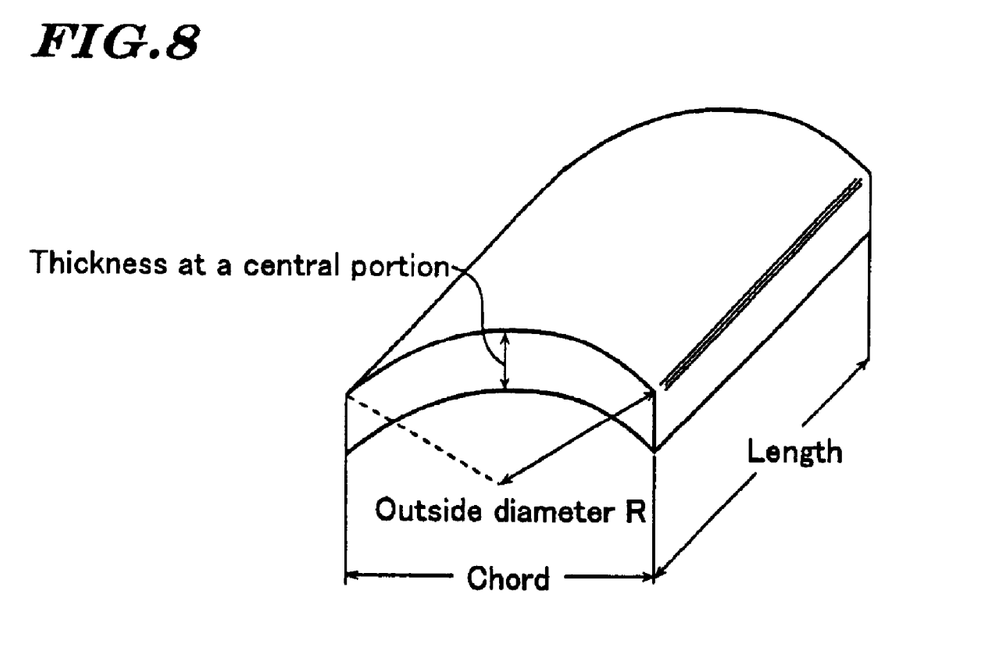
FIG. 8 is a schematic illustration of a bow-shaped magnet used in Example 4.

The following experiment was carried out using a deposited-film forming apparatus similar to that used in Example 1. Bow-shaped magnet test pieces each having an outside diameter R of 25 mm, a thickness of 2 mm at a central portion, a chord of 30 mm and a length of 32 mm (see FIG. 8 for the outline of the shape) were subjected to a shot blasting to remove an oxide layer formed on a surface of each of the magnet test pieces by a surface treatment at a preceding step. A deposited film of aluminum was formed on a surface of each of the magnet test pieces in the same manner as in Example 1, except that the seventy-five magnet test pieces with their oxide layers removed were placed into each of the twelve cylindrical barrels (a total of 900 magnet test pieces were accommodated in the twelve cylindrical barrels), and then subjected to the depositing treatment for 20 minutes after fixing of the cylindrical barrels to the support members.

The magnet test pieces were left to cool, and then examined for the damaging of the deposited film of aluminum formed on each of their surfaces, for the production of projections on the deposited film and for the cracking and breaking of the magnet test pieces themselves. A thickness of the deposited film of aluminum on outer and inner surfaces of each of the magnet test pieces (except the magnet test pieces having portions exposed due to the damaging, the projections or the cracking and breaking) was measured in the same manner as in Example 1. Results (average value of n=10) of the measurement are shown in Table 2. The number of defective products evaluated in the same manner as in Example 1 is also shown in Table 2.

As apparent from Table 2, by carrying out the formation of a deposited film of aluminum on the surface of each of the magnet test pieces using the deposited-film forming apparatus according to the first embodiment of the present invention, the magnet test pieces are stirred homogenously, whereby uniform films with a smaller difference between thickness values on the outer and inner surfaces can be formed without the occurrence of damaging of the deposited films of aluminum, the production of projections on the deposited film and the cracking and breaking of the magnet test pieces themselves.

Comparative Example 2

The following experiment was carried out using a deposited-film forming apparatus similar to that used in Comparative Example 1. Bow-shaped magnet test pieces having the same dimensions as the magnet test pieces used in Example 4 were subjected to a shot blasting to remove an oxide layer formed on a surface of each of the magnet test pieces by a surface treatment at a preceding step. 900 Magnet test pieces with their oxide layers removed were placed into the cylindrical barrel and then, a deposited film of aluminum was formed on a surface of each of the magnet test pieces in the same manner as in Example 4.

The magnet test pieces were left to cool, and then examined for the damaging of the deposited film of aluminum formed on each of their surfaces, for the production of projections on the deposited film and for the cracking and breaking of the magnet test pieces themselves. A thickness of the deposited film of aluminum on outer and inner surfaces of each of the magnet test pieces (except the magnet test pieces having portions exposed due to the damaging, the projections or the cracking and breaking) was measured in the same manner as in Example 1. Results (average value of n=10) of the measurement are shown in Table 2. The number of defective products evaluated in the same manner as in Example 1 is also shown in Table 2.

As apparent from Table 2, when the deposited film of aluminum was formed on the surface of each of the magnet test pieces using the prior art deposited-film forming apparatus, the number of defective products was far larger, as compared with the deposited film of aluminum formed using the deposited-film forming apparatus according to the first embodiment of the present invention, and there was a large difference in thickness between the film on the outer surface and the film on the inner surface.

TABLE 2

| | Thickness ($\mu$m) | | Number of defective |
| --- | --- | --- | --- |
| | On outer surface | On inner surface | products |
| Example 4 | 6.3 | 4.9 | 0/900 |
| Comparative Example 2 | 7.2 | 3.9 | 7/900 |

Although the embodiments of the present invention have been described in detail, it will be understood that the present invention is not limited to the above-described embodiments, and various modifications in design maybe made without departing from the spirit and scope of the invention defined in claims.

What is claimed is:

1. A deposited-film forming apparatus comprising an evaporating section for at least one depositing material selection of the group consisting of aluminum, zinc, tin and magnesium and an alloy containing at least one of these metal components, and a plurality of tubular barrels formed of a mesh net for accomodation of rare earth metal-based permanent magnets, on each of the surfaces of which a depositing material is to be deposited, said evaporating section and said tubular barrels being mounted in a vacuum-treating chamber, wherein said tubular barrels are detachably supported by support shafts provided at each side of each tubular barrel circumferentially outside a horizontal rotational axis of a support member rotatable about said rotational axis, for rotation about said rotational axis, so that the distance between said tubular barrel rotated about said rotated about said rotational axis of said support member and said evaporating section is varied by rotating said support member, wherein said evaporating section receives electric current and heats the at least one depositing material by resistance heating, with the at least one depositing material being molten at said evaporating section.

2. A deposited-film forming apparatus according to claim 1, wherein said plurality of said tubular barrels is supported in an annular shape circumferentially outside said rotational axis of said support member.

* * * * *

UNITED STATES PATENT AND TRADEMARK OFFICE
CERTIFICATE OF CORRECTION

PATENT NO. : 6,872,260 B2  Page 1 of 3
APPLICATION NO. : 09/813129
DATED : March 29, 2005
INVENTOR(S) : Takeshi Nishiuchi et al.

It is certified that error appears in the above-identified patent and that said Letters Patent is hereby corrected as shown below:

In the drawings, change Figure 3 from

UNITED STATES PATENT AND TRADEMARK OFFICE
CERTIFICATE OF CORRECTION

PATENT NO. : 6,872,260 B2  
APPLICATION NO. : 09/813129  
DATED : March 29, 2005  
INVENTOR(S) : Takeshi Nishiuchi et al.

It is certified that error appears in the above-identified patent and that said Letters Patent is hereby corrected as shown below:

In the Drawings, change Figure 4 from to

UNITED STATES PATENT AND TRADEMARK OFFICE
CERTIFICATE OF CORRECTION

PATENT NO. : 6,872,260 B2
APPLICATION NO. : 09/813129
DATED : March 29, 2005
INVENTOR(S) : Takeshi Nishiuchi et al.

It is certified that error appears in the above-identified patent and that said Letters Patent is hereby corrected as shown below:

In the Drawings, change Figure 5 from to

Signed and Sealed this

First Day of January, 2008

JON W. DUDAS
*Director of the United States Patent and Trademark Office*